United States Patent [19]
Abraham et al.

[11] Patent Number: 5,952,244

[45] Date of Patent: Sep. 14, 1999

[54] METHODS FOR REDUCING ETCH RATE LOADING WHILE ETCHING THROUGH A TITANIUM NITRIDE ANTI-REFLECTIVE LAYER AND AN ALUMINUM-BASED METALLIZATION LAYER

[75] Inventors: Susan C. Abraham, San Jose; Peter H. Chen; Jerry Yang, both of Milpitas, all of Calif.

[73] Assignee: LAM Research Corporation, Fremont, Calif.

[21] Appl. No.: 08/601,780

[22] Filed: Feb. 15, 1996

[51] Int. Cl.⁶ .................................................. H01L 21/3065
[52] U.S. Cl. .......................... 438/714; 438/720; 438/738
[58] Field of Search ........................ 156/650.1, 651.1, 156/652.1, 643.1; 216/63, 67, 72, 74, 75, 77; 438/706, 707, 710, 720, 735, 737, 738, 742, 714

[56] References Cited

U.S. PATENT DOCUMENTS

| | | | |
|---|---|---|---|
| 4,267,012 | 5/1981 | Pierce et al. | 156/643 |
| 4,740,485 | 4/1988 | Sharpe-Geisler | 437/246 |
| 4,878,994 | 11/1989 | Jucha et al. | 156/643 |
| 4,980,018 | 12/1990 | Mu et al. | 156/643 |
| 5,256,245 | 10/1993 | Keller, et al. | 156/643 |
| 5,286,675 | 2/1994 | Chen et al. | 437/195 |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,399,237 | 3/1995 | Keswick et al. | 156/643 |
| 5,411,631 | 5/1995 | Hori et al. | 216/72 |
| 5,429,070 | 7/1995 | Campbell et al. | 118/723 |
| 5,443,941 | 8/1995 | Bariya et al. . | |
| 5,496,762 | 3/1996 | Sandhu et al. | 437/60 |
| 5,522,520 | 6/1996 | Kawamoto | 216/62 |
| 5,540,812 | 7/1996 | Kadomura | 156/652.1 |
| 5,545,289 | 8/1996 | Chen et al. | 156/643.1 |
| 5,550,085 | 8/1996 | Liu | 437/203 |
| 5,562,801 | 10/1996 | Nulty | 156/643.1 |
| 5,609,775 | 3/1997 | Liu | 216/77 |
| 5,620,615 | 4/1997 | Keller | 438/720 |
| 5,665,641 | 9/1997 | Shen et al. | 438/643 |
| 5,772,906 | 6/1998 | Abraham | 216/72 |

FOREIGN PATENT DOCUMENTS

| | | | |
|---|---|---|---|
| 489 407 A2 | 6/1992 | European Pat. Off. | H01L 37/32 |
| 622 477 A1 | 11/1994 | European Pat. Off. | C23F 4/00 |

OTHER PUBLICATIONS

Riley, P; Holbert, R; Kavari, R; and Lujan, L., "Composite metal etching for submicron integrated circuits" Extented Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomomena, vol. 10, No. 5, Oct. 1992, pp. 2133–2147.

Patent Abstracts of Japan, vol. 95, No. 6, Jul. 31, 1995.

T. H. Ahn, S.W. Nam, K.J. Min, and C. Chung, "Effect of Residual Gases on Residue Formation during Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

*Primary Examiner*—Marion McCamish
*Assistant Examiner*—Cheryl Juska
*Attorney, Agent, or Firm*—Beyer & Weaver LLP

[57] ABSTRACT

A method, in a plasma processing chamber, for etching through a selected portion of layers of a wafer stack, which comprises an anti-reflective layer and a metallization layer disposed below the anti-reflective layer. The method comprises the step of etching at least partially through the anti-reflective layer of the wafer stack with a first chemistry that comprises both an etchant chemical and a polymer-forming chemical. Further, the method comprises the step of etching at least partially through the metallization layer of the wafer stack with a second chemistry different from the first chemistry.

18 Claims, 3 Drawing Sheets

METHODS FOR REDUCING ETCH RATE LOADING WHILE ETCHING THROUGH A TITANIUM NITRIDE ANTI-REFLECTIVE LAYER AND AN ALUMINUM-BASED METALLIZATION LAYER

BACKGROUND OF THE INVENTION

The present invention relates to the fabrication of semiconductor integrated circuits (IC's). More particularly, the present invention relates to methods and apparatus for etching through an IC's layer stack, including the metallization layer, during IC fabrication.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form the desired circuit. To facilitate discussion, FIG. 1 illustrates a cross-section view of a layer stack 20, representing the layers formed during the fabrication of a typical semiconductor IC. It should be noted that other additional layers above, below, or between the layers shown may be present. Further, not all of the shown layers need necessarily be present and some or all may be substituted by other different layers.

At the bottom of layer stack 20, there is shown a wafer 100. An oxide layer 102, typically comprising $SiO_2$, is formed above wafer 100. A barrier layer 104, typically formed of Ti, TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al-Cu, Al-Si, or Al-Cu-Si. The remaining two layers of FIG. 1, i.e., an anti-reflective coating (ARC) layer 108 and an overlaying photoresist (PR) layer 110, are then formed atop metallization layer 106. The ARC layer 108, typically comprising TiN or TiW, helps prevent light (e.g., from the lithography step that patterns the photoresist) from being reflected and scattered off the surface of the metallization layer 106 and may, in some cases, inhibit hillock growth. Photoresist layer 110 represents a layer of conventional photoresist material, which may be patterned for etching, e.g., through exposure to ultraviolet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, e.g., metallization layer 106, are etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask are then etched away, leaving behind metallization interconnect lines or features.

For illustration purposes, FIG. 2 shows a cross-section view of layer stack 20 of FIG. 1 after conventional etching is completed. In this example, the metallic interconnect lines are represented by the unetched portions of metallization layer 106.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in the wider, open field regions. This phenomenon, referred herein as the loading in etch rates, may be a consequence of microloading and aspect ratio dependent etching (ARDE). Mircroloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates among trenches that are located in areas of similar trench density and among trenches that have different aspect ratios. The loading in etch rates causes trenches to be formed in the layer stack at different rates. The loading in etch rates becomes more severe when trench widths fall below about 0.5 microns, and especially when trench widths fall below about 0.35 microns. As a result of the etch rate variations, by the time metal etching is complete in areas having a slow etch rate (e.g., in the narrower line spacings), overetching, i.e., the inadvertent removal of materials from underlying layers, may already occur in areas having a higher etch rate (e.g., the open field regions).

With reference to FIG. 2, area 120 represents the open field region where the metallization layer is overetched (by distance d1), and area 122 represents the underetched area, where the metallization is underetched (by distance d2). If the etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

In view of the foregoing, what is desired is improved methods and apparatus for reducing the loading in etch rates in the etching of the layer stack.

SUMMARY OF THE INVENTION

The present invention relates, in one embodiment, to a method, in a plasma processing chamber, for etching through a selected portion of layers of a wafer stack, which comprises an anti-reflective layer and a metallization layer disposed below the anti-reflective layer. The method comprises the step of etching at least partially through the anti-reflective layer of the wafer stack with a first chemistry that comprises both an etchant chemical and a polymer-forming chemical. Further, the method comprises the step of etching at least partially through the metallization layer of the wafer stack with a second chemistry different from the first chemistry.

In another embodiment, the present invention relates to an integrated circuit having components formed out of layers of a wafer stack in a plasma processing chamber according to a two-chemistry etch process. The wafer stack comprises a metallization-overlaying layer and a metallization layer disposed below the metallization-overlaying layer. The two-chemistry etch process comprises the steps of etching at least partially through the metallization-overlaying layer of the wafer stack with a first chemistry that comprises both an etchant chemical and a polymer-forming chemical. The process further comprises etching at least partially through the metallization layer of the wafer stack with a second chemistry different from the first chemistry.

In yet another embodiment, the invention relates to a method, in a plasma processing chamber, for etching through a selected portion of layers of a wafer stack, which comprises a TiN layer. The method comprises the step of etching at least partially through the TiN layer of the wafer stack with a first chemistry. The first chemistry is selected from the group consisting of a first mixture that comprises $Cl_2$ and $N_2$, a second mixture that comprises $Cl_2$ and $CHF_3$, and a third mixture that comprises $Cl_2$, $N_2$, and $CHF_3$.

These and other advantages of the present invention will become apparent upon reading the following detailed descriptions and studying the various figures of the drawings.

DETAILED DESCRIPTION OF THE PREFERRED EMBODIMENTS

An invention is described for minimizing the etch rate loading problem while achieving commercially advantageous etch rates and selectivities. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 2:
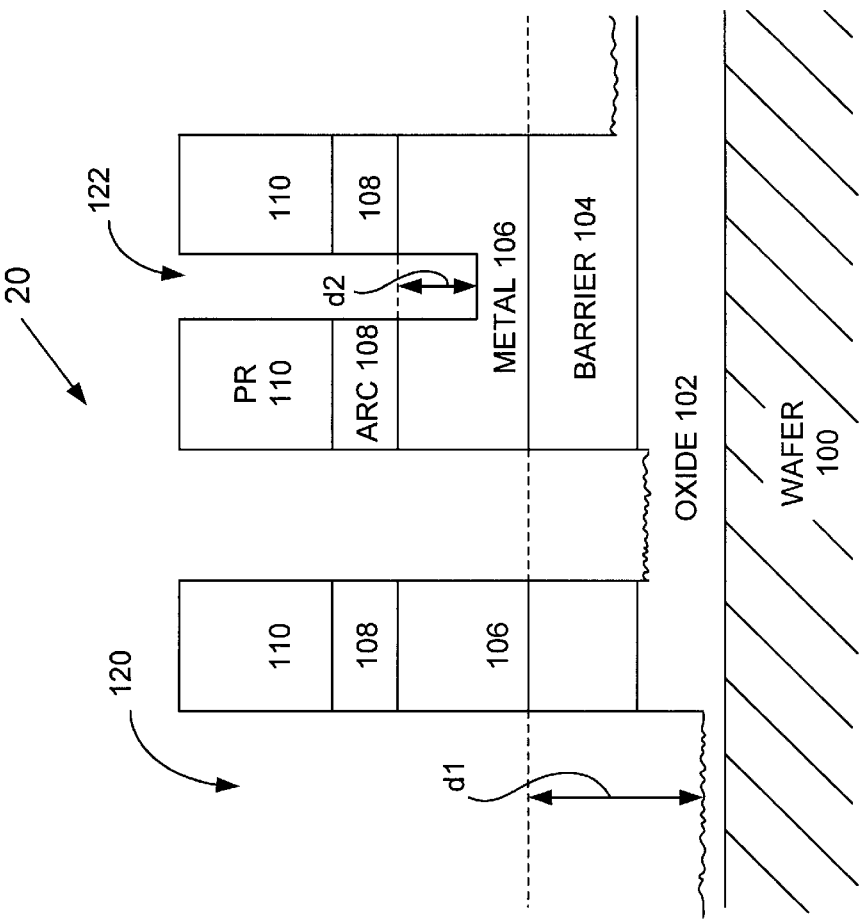
FIG. 2 illustrates a cross-section view of the layer stack of FIG. 1 after conventional etching is completed.
Figure 1:
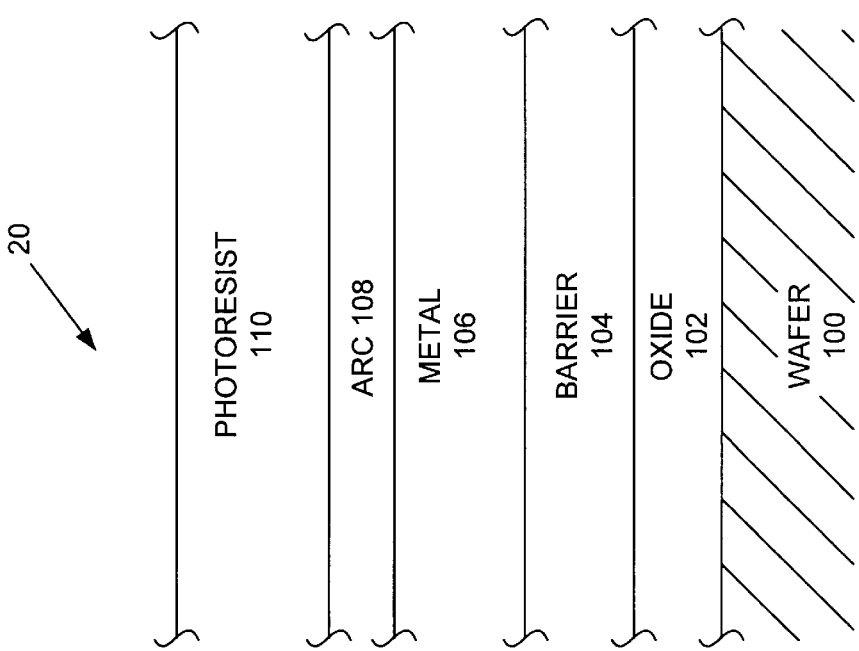
FIG. 1 illustrates a cross-section view of a layer stack, representing the layers formed during the fabrication of a typical semiconductor IC.

In accordance with one aspect of the present invention, the aforementioned etch rate loading problem is alleviated by etching the layer stack in two steps with two different chemistries. This first chemistry etching step preferably proceeds at least through the ARC layer, e.g., ARC layer 108 of FIG. 1. In addition to the main etchant gas that is employed to etch through part of the aforementioned ARC layer, the first chemistry preferably includes a polymer-forming gas. Thereafter, the layer stack is etched again, albeit with a second chemistry that may be different from the first chemistry. This second chemistry etching step is then preferably allowed to proceed at least partially through the metallization layer, e.g., layer 106 of FIG. 1.

The inventive two-chemistry etch process may be performed in any of the known plasma processing apparatuses, including those adapted for dry etching, plasma etching, reactive ion etching (RIE), magnetically enhanced reactive ion etching (MERIE), or the like. To further elaborate, in a typical plasma processing chamber adapted for dry etching, the wafer is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the wafer and etch away at the plasma-contacting layer of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are available from Lam Research Corporation of Fremont, Calif.

Figure 3:
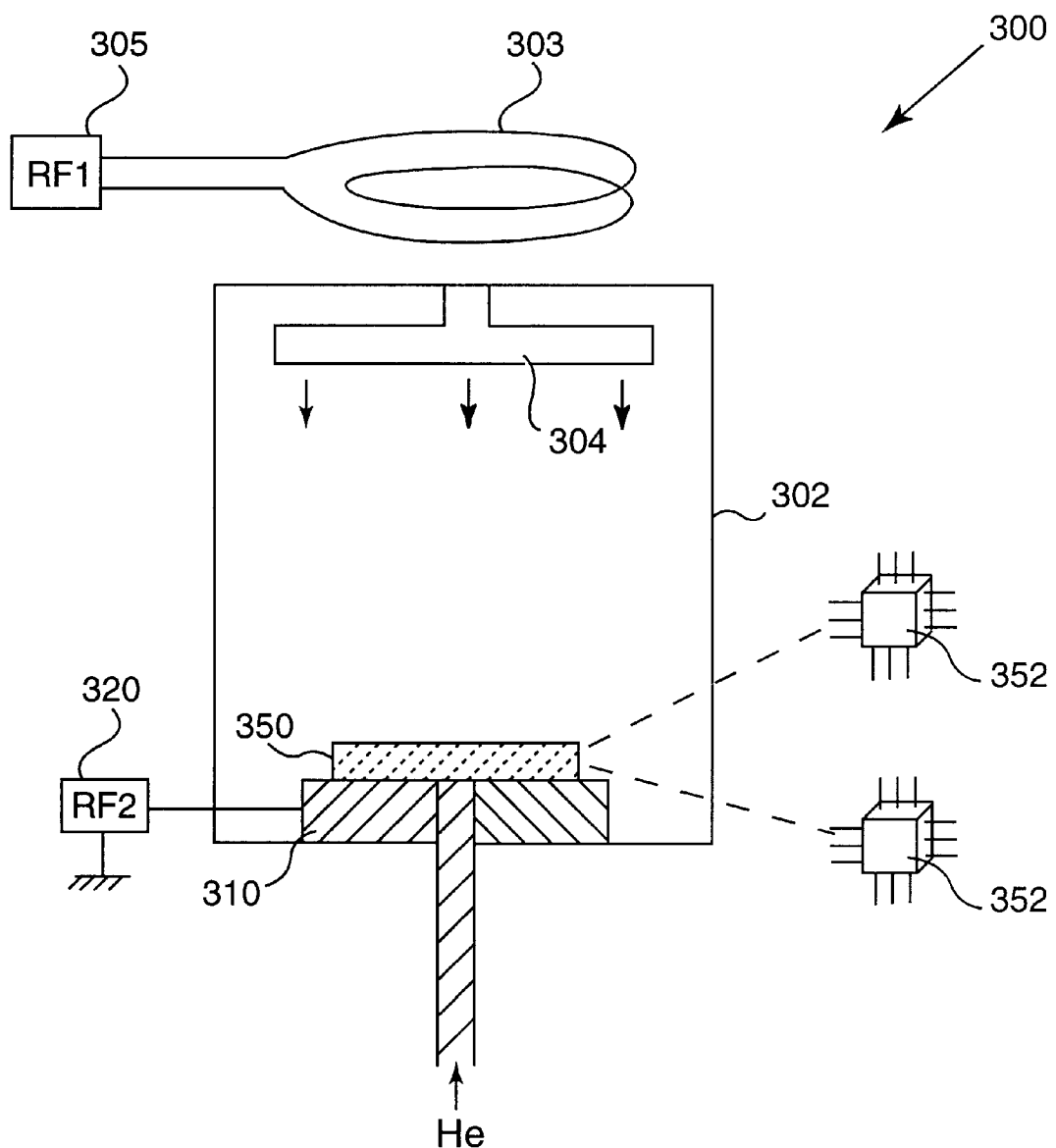
FIG. 3 is a simplified schematic diagram of a plasma reactor that may be suitably employed with the inventive two-chemistry etch technique.

In a preferred embodiment, the present invention is employed in a TCP™ 9600 SE plasma reactor, which is available from Lam Research Corporation, although, as mentioned above, any other conventional and suitable plasma processing systems may well be employed. FIG. 3 illustrates a simplified schematic of the TCP™ 9600 SE plasma reactor, including wafer 350 and integrated circuit chips 352, which are fabricated from dies cut from wafer 350 after the wafer is etched according to the inventive etch and processed in conventional post-etch steps. Referring to FIG. 3, a wafer reactor 300 includes a plasma processing chamber 302. Above chamber 302, there is disposed an electrode 303, which is implemented by a coil in the example of FIG. 1. Coil 303 is energized by a RF generator 305 via a matching network (not shown in FIG. 3).

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network). Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low, e.g., between about 8 to 22 mTorr in one embodiment. A plurality of heaters (omitted from FIG. 1 to simplify the illustration) may be provided to maintain a suitable chamber temperature for etching (e.g., about 70° C. in one embodiment). To provide a path to ground, the chamber wall of chamber 302 is typically grounded.

Figure 4:
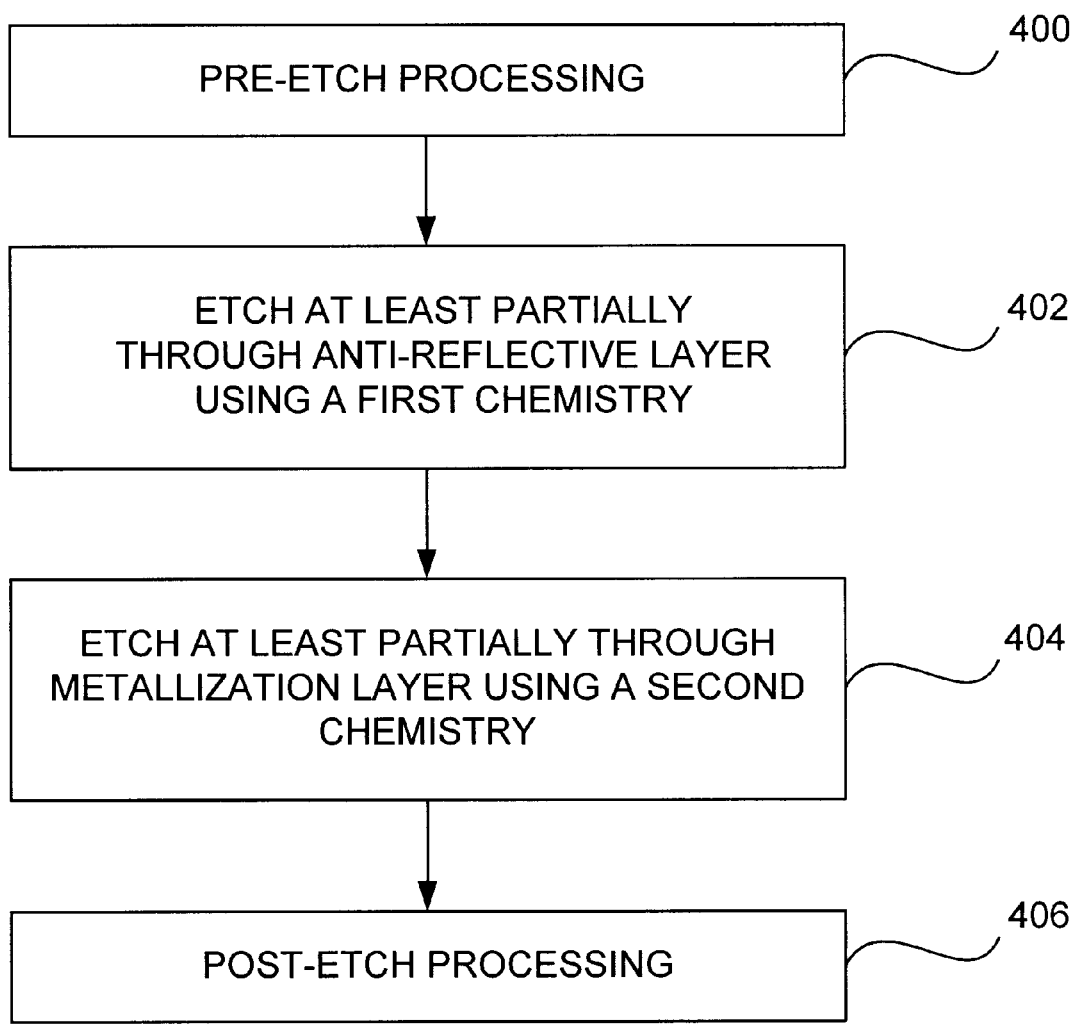
FIG. 4 shows, in accordance with one aspect of the present invention, the steps involved in the inventive two-chemistry etch technique.

FIG. 4 shows, in accordance with one aspect of the present invention, the steps involved in the inventive two-chemistry etch process. In step 400, the wafer is prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 402, the anti-reflective layer of the wafer stack is etched with a first chemistry. It should be borne in mind that although this embodiment and the remainder of the disclosure contemplates the anti-reflective layer being the layer that undergoes etching with the first chemistry, this first chemistry etching may also be performed, in certain wafer stack structures, on any metallization-overlaying layer, e.g., adhesion layer, seed layer, or the like. As the term is employed herein, a metallization-overlaying layer represents a layer that is disposed above the metallization layer. Further, this overlaying layer may be formed either of TiN or a material that is mainly titanium. In accordance with this embodiment, etching with the first chemistry preferably terminates when it is determined that the anti-reflective layer is etched through. In one embodiment, the anti-reflective layer is formed of TiN, and endpoint detection is accomplished by optically monitoring the rise of the 703 nm wavelength in the plasma, which indicates that substantially all the TiN anti-reflective layer has been removed. Etching may then terminate immediately or may be allowed to continue for a predetermined period of time, e.g., an additional five seconds, to ensure the complete removal of the TiN anti-reflective layer material. Other conventional methods to determine the termination point for this first chemistry etch step may also be employed.

In accordance with one aspect of the present invention, the first chemistry for a TiN anti-reflective layer etch may include any one of the group consisting of $Cl_2/N_2$, $Cl_2/N_2/Ar$, $Cl_2/Ar$, $Cl_2/N_2/HCl$, $Cl_2/HCl$, $Cl_2/N_2/CHF_3$, $Cl_2/CHF_3$, and $Cl_2/Ar/CHF_3$. More preferably, the first chemistry may include any one of the group consisting of $Cl_2/N_2$, $Cl_2/CHF_3$, $Cl_2/N_2/CHF_3$ and $Cl_2/Ar/CHF_3$. Most preferably, the first chemistry for a TiN anti-reflective layer etch is $Cl_2/Ar/CHF_3$. It is contemplated that the argon in the $Cl_2/Ar/CHF_3$ may be substituted by other noble gases such as helium, krypton, xenon, or the like. $Cl_2/Ar/CHF_3$ also provides other advantageous results, which are discussed in greater detail in a copending, commonly assigned patent application entitled "Methods and Apparatus for Etching Semiconductor Wafers" U.S. patent application Ser. No. 08/602,251, filed on even date and incorporated herein by reference.

As mentioned earlier, the first chemistry preferably includes a polymer-forming chemical (e.g., $N_2$, $CHF_3$, or the like) in addition to the chemical that is mainly responsible for etching (e.g., $Cl_2$). In this manner, the first chemistry etches away the overlaying layer (e.g., the TiN ARC layer) while simultaneously deposits polymer on this overlaying layer. It is believed that the use of a polymer-forming agent in the first chemistry micromasks the wider spacings, i.e., causing masking polymers to be deposited in the wider spacings at a faster rate than in the narrower spacings. Due to the micromasking phenomenon, the etch rate in the wider spacings are slowed, thereby reducing the difference between the etch rate in the wider spacings and that in the narrower spacings.

In one embodiment, the flow volume (in sccm) of the polymer-forming agent, e.g. $N_2$, is about 5–20%, and more preferably about 5–10%, of the total first chemistry flow volume (in sccm). The etch rate may be adjusted by appropriately modifying the flow volume ratio of the polymer-forming agent. By way of example, increasing the ratio of the flow volume of the polymer-forming agent tends to reduce the etch rate due to the increase in polymer deposition during etching.

In step 404, the remainder of the layer stack is etched down at least partially through the metallization layer with a second chemistry. For example, the second chemistry may be employed to etch through most of the metallization layer, with the remainder and/or the barrier layer underneath being etched with yet another chemistry. Preferably, however, the second chemistry etch step proceeds through the metallization layer and most preferably, down to the oxide layer, before being terminated. The second chemistry is preferably different from the first chemistry because if a polymer creating gas is employed for the bulk etch, e.g., through the aluminum metallization layer, it could result in residues due to the micromasking and may also lower the photoresist selectivity. The use of novel first chemistries (to etch through the ARC layer) that are different from this second chemistry represents a significant feature of the present invention. This is in significant contrast to the prior art wherein the etching is performed with only one chemistry (typically $Cl_2/BCl_3$) to etch through both the TiN ARC layer and the metallization layer.

The inventive approach differs significantly from the prior art two-chemistry approach. In the prior art, a two-chemistry approach is employed when titanium tungsten (TiW) is employed as the ARC layer material, not when titanium nitrate (TiN) is the ARC layer material. To elaborate, the prior art approach employs an $SF_6$ first chemistry to etch away the TiW ARC layer. The remaining layers are then bulk-etched with another chemistry, e.g., $Cl_2/BCl_3$, since $SF_6$ does not etch aluminum well. It should be noted that $SF_6$ is employed in the prior art as the first chemistry for its ability to etch the TiW material, not to reduce etch rate loading. Further, the prior art approach does not involve the addition of a polymer-forming gas to the etchant chemical in the first chemistry since $SF_6$ functions as both the etchant and the polymer-forming gas in the first chemistry.

$SF_6$ also has a high etch rate to photoresist. Consequently, it is typically necessary to employ a thicker photoresist layer when TiW is the ARC layer material in order to adequately protect the underlaying features against the $SF_6$ etchant.

When TiN is employed as the material for the ARC layer, however, the approach in the art has been to employ a single chemistry, e.g., $Cl_2/BCl_3$, for both the ARC layer etch and the bulk etch. This is because the TiN etchant, e.g., the $Cl_2$, does not suffer the photoresist selectivity problem associated with $SF_6$, i.e., $Cl_2$ does not have high etch rate to photoresist.

The use of a polymer-forming gas in the first chemistry also represents an unobvious feature of the present invention since polymer-forming gases tend to etch away photoresist at a faster rate, i.e., its addition to an etching chemistry reduces photoresist selectivity. The use of a polymer-forming gas in the first chemistry is then contrary to conventional approaches, which strive to increase photoresist selectivity. Since the first chemistry of the present invention, which includes a polymer-forming gas in addition to an etchant chemical, is employed for only a short time to etch through the thin overlaying layer, e.g., the TiN ARC layer, the resulting data does not indicate any undue detrimental results.

In accordance with one aspect of the present invention, the etch rate loading may be reduced by using a different chemistry in the beginning of the etch (e.g., on the layer overlaying the metallization layer such as the ARC layer) to resolve the etch rate loading issue at this beginning stage. Thereafter, the bulk etch may proceed using conventional chemistries to etch the remaining layers.

The second chemistry itself may include any suitable etchant and bombardment chemicals for etching through the metallization layer. In one embodiment, the second chemistry is any one of the group comprising $Cl_2/BCl_3$, $Cl_2/BCl_3/CHF_3$, $Cl_2/BCl_3/CHF_3$, $Cl_2/BCl_3/HCl$, $Cl_2/BCl_3/N_2$, and $Cl_2/N_2$. By way of example, a mixture of $Cl_2/BCl_3/CHF_3$ having a flow volume ratio of 70:20:10 (in sccm) has been found to be suitable for etching through a metallization layer which comprises an alloy of aluminum having about 0.5%–1% of copper.

In the prior art one-chemistry $Cl_2/BCl_3$ etch, the etch rate loading for a 6-inch wafer and 0.35 micron geometry is found to be about 25%–30%, i.e., the etch rate in the open field regions is about 25%–30% faster than that in the 0.35 micron spacings. Under similar process parameters, the etch rate loading achieved for a two-chemistry etch that employs, in accordance with one embodiment of the present invention, $Cl_2/N_2$ as the first chemistry for etching the TiN ARC layer is found to be as little as about 3% at the center of the wafer and about 10% along the wafer edge. The etch rate loading values for a two-chemistry etch that employs $Cl_2/CHF_3$ as the first chemistry for etching the TiN ARC layer is found to be about 8% and about 4% for the wafer center and the wafer edge respectively. The etch rate loading values for a two-chemistry etch that employs $Cl_2/Ar/CHF_3$ as the first chemistry for etching the TiN ARC layer is found to be about 3% and about 2% for the wafer center and the wafer edge respectively.

Due to the reduced etch rate loading, the etching time does not have to be extended to allow the metal layer to be etched through in the narrow spacings. The shorter etching time leads to less damage to the protective photoresist mask regions during etching, thereby improving the ability of the photoresist mask regions to protect the underlying features during etching.

It is also found that the use of the inventive two-chemistry etch results in overall etch rates and TiN-to-aluminum selectivity that are within commercially advantageous ranges. By way of example, the etch rate for the ARC TiN layer for the inventive two-chemistry etch in which $Cl_2/N_2/CHF_3$, $Cl_2/CHF_3$, $Cl_2/Ar/CHF_3$ are employed as the first chemistry are, in one embodiment, about 8,000 angstroms/minute, 9,500 angstroms/minute and 9,000 angstroms/minute respectively. The TiN-to-aluminum selectivity for the $Cl_2/Ar/CHF_3$ is, in one embodiment, about 4:1. Further, the composite etch uniformity (i.e., of both the ARC layer etch and the bulk etch) for the aforementioned chemistries are, in one embodiment, about 5.97, 8.32, and 8.36, respectively.

Etching with the second chemistry may terminate when a portion of the metallization layer is etched through. In this case, another chemistry may be employed to etch through the remaining of the metallization layer. More preferably, etching with the second chemistry terminates when it is determined that the metallization layer is etched through. In one embodiment, the metallization layer is formed of aluminum or one of its alloys, and endpoint detection is accomplished by optically monitoring the rise of the 261 nm optical wavelength in the plasma, which indicates that substantially all of the aluminum metallization layer has been removed. The second chemistry etch may then terminate immediately or may be allowed to continue for a predetermined period of time, e.g., a few additional seconds, to ensure complete removal of the metallization layer material.

In one embodiment, the second chemistry etch is extended to etch through the barrier layer. In another embodiment, however, another chemistry may be employed to etch through the barrier layer. Again, other conventional methods to determine the termination point for this second chemistry etch step may also be employed.

In step 406, the wafer undergoes additional post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

By way of example, Tables 1, 2, 3, and 4 below show the approximate process parameters that may be suitable for the first chemistry etch of a 6" wafer in a TCP™ 9600 SE plasma reactor. In this example, the metallization-overlaying layer is a TiN anti-reflection layer, which overlays an aluminum layer containing approximately 0.5% copper. In these tables, an approximate suitable range, an approximate preferred range, and an approximate more preferred range of the top electrode power (in watts), bottom electrode power (in watts), and flow rates (in percentage of total etchant source flow rate unless otherwise specified) are shown. Table 1 illustrates the approximate suitable parameters for the $Cl_2/N_2$ first chemistry; table 2 illustrates the approximate suitable parameters for the $Cl_2/CHF_3$ first chemistry; table 3 illustrates the approximate suitable parameters for the $Cl_2/Ar/CHF_3$ first chemistry, and table 4 illustrates the approximate suitable parameters for the $Cl_2/N_2/CHF_3$. Other parameter values that may be helpful for the etch will be readily apparent to those skilled in the art, whether for the same wafer and anti-reflection layer or other wafers and anti-reflection layers.

TABLE 1

| FIRST CHEMISTRY | | TOP POWER | BOTTOM POWER | FLOW RATE | |
|---|---|---|---|---|---|
| $CL_2/N_2$ | Range | 350–650 | 100–350 | 70%–95% $Cl_2$ | 5%–30% $N_2$ |
| | Preferred Range | 400–600 | 120–200 | 80%–90% $Cl_2$ | 10%–20% $N_2$ |
| | More Preferred Range | 560 | 140 | 83.3% $Cl_2$ | 16.7% $N_2$ |

TABLE 2

| FIRST CHEMISTRY | | TOP POWER | BOTTOM POWER | FLOW RATE | |
|---|---|---|---|---|---|
| $CL_2/CHF_3$ | Range | 350–650 | 100–350 | 75%–95% $Cl_2$ | 5%–25% $CHF_3$ |
| | Preferred | 400–600 | 120–200 | 80%–90% | 10%–20% |

TABLE 2-continued

| FIRST CHEMISTRY | | TOP POWER | BOTTOM POWER | FLOW RATE | |
|---|---|---|---|---|---|
| | Range More Preferred Range | 560 | 140 | $Cl_2$ 83.3% $Cl_2$ | $CHF_3$ 16.7% $CHF_3$ |

TABLE 3

| FIRST CHEMISTRY | | TOP POWER | BOTTOM POWER | FLOW RATE | | |
|---|---|---|---|---|---|---|
| $CL_2/Ar/CHF_3$ | Range | 350–650 | 100–350 | 30 sccm–110 sccm $Cl_2$ | 12.5%–30% (of $Cl_2$ flow) $CHF_3$ | 19%–50% (of $Cl_2$ flow) Ar |
| | Preferred Range | 400–600 | 120–200 | 35 sccm–80 sccm $Cl_2$ | 15%–25% (of $Cl_2$ flow) $CHF_3$ | 25%–40% (of $Cl_2$ flow) Ar |
| | More Preferred Range | 560 | 140 | 40 sccm $Cl_2$ | 17.5% (of $Cl_2$ flow) $CHF_3$ | 37.5% (of $Cl_2$ flow) Ar |

TABLE 4

| FIRST CHEMISTRY | | TOP POWER | BOTTOM POWER | FLOW RATE | | |
|---|---|---|---|---|---|---|
| $CL_2/N_2/CHF_3$ | Range | 350–650 | 100–350 | 30 sccm–110 sccm $Cl_2$ | 12.5%–50% (of $Cl_2$ flow) $N_2$ | 12.5%–37.5% (of $Cl_2$ flow) $CHF_3$ |
| | Preferred Range | 400–600 | 120–200 | 35 sccm–80 sccm $Cl_2$ | 20%–37.5% (of $Cl_2$ flow) $N_2$ | 20%–30% (of $Cl_2$ flow) $CHF_3$ |
| | More Preferred Range | 560 | 140 | 40 sccm $Cl_2$ | 25% $N_2$ | 25% (of $Cl_2$ flow) $CHF_3$ |

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for reducing etch rate loading while etching through a selected portion of layers of a wafer stack in a plasma processing chamber, said wafer stack comprising an anti-reflective layer and a metallization layer disposed below said anti-reflective layer, said method comprising:

etching at least partially through said anti-reflective layer of said wafer stack with a first source gas, said first source gas being selected from the group consisting essentially of $Cl_2/N_2/HCl$, and $Cl_2/HCl$; and etching at least partially through said metallization layer of said wafer stack with a second source gas configured to form a plasma capable of etching said metallization layer, said second source gas being different from said first source gas.

2. The method of claim 1 wherein said anti-reflective layer comprises TiN.

3. The method of claim 1 wherein said first source gas consists essentially of $Cl_2/N_2/HCl$.

4. The method of claim 3 wherein said anti-reflective layer comprises TiN.

5. The method of claim 1 wherein said first source gas consists essentially of $Cl_2/HCl$.

6. The method of claim 5 wherein said anti-reflective layer comprises TiN.

7. The method of claim 1 wherein said second source gas comprises $Cl_2/BCl_3$.

8. The method of claim 1 wherein said anti-reflective layer comprises TiN and wherein said first source gas is employed to etch through said anti-reflective layer.

9. The method of claim 1 wherein said second source gas is selected from the group consisting essentially of $Cl_2/BCl_3$, $Cl_2/BCl_3/CHF_3$, $Cl_2/BCl_3/HCl$, $Cl_2/BCl_3/N_2$, and $Cl_2/N_2$.

10. A method for etching through a selected portion of layers of a wafer stack in a plasma processing chamber, said wafer stack comprising a TiN layer, said method comprising:

etching at least partially through said TiN layer of said wafer stack with a first source gas, said first source gas being selected from the group consisting essentially of:
a first mixture, said first mixture consisting essentially of $Cl_2/N_2/HCl$, and
a second mixture, said second mixture consisting essentially of $Cl_2/HCl$.

11. The method of claim 10 wherein said TiN layer represents an anti-reflective layer.

12. The method of claim 11 wherein said wafer stack further comprising a metallization layer underlying said TiN layer, said method further comprising:

etching at least partially through said metallization layer with a second source gas configured to form a plasma capable of etching said metallization layer, said second source gas being different from said first source gas.

13. The method of claim 12 wherein said metallization layer comprises aluminum.

14. The method of claim 13 wherein said second source gas comprises $Cl_2/BCl_3$.

15. The method of claim 12 wherein said second source gas is selected from the group consisting essentially of $Cl_2/BCl_3$, $Cl_2/BCl_3/CHF_3$, $Cl_2/BCl_3/HCl$, $Cl_2/BCl_3/N_2$, and $Cl_2/N_2$.

16. A method for etching through a selected portion of layers of a wafer stack in a plasma processing chamber, said wafer stack comprising a TiN-containing layer disposed above an aluminum-containing layer, said method comprising:

etching at least partially through said TiN-containing layer of said wafer stack with a first source gas, said first source gas being selected from the group consisting essentially of $Cl_2/N_2/HCl$ and $Cl_2/HCl$; and etching at least partially through said aluminum-containing layer of said wafer stack with a second source gas configured to form a plasma capable of etching said aluminum-containing layer, said second source gas being different from said first source gas.

17. The method of claim 16 wherein said second source gas is selected from the group consisting essentially of $Cl_2/BCl_3$, $Cl_2/BCl_3/CHF_3$, $Cl_2/BCl_3/HCl$, $Cl_2/BCl_3/N_2$, and $Cl_2/N_2$.

18. The method of claim 16 wherein said plasma processing chamber is an inductively coupled plasma processing chamber.

* * * * *